United States Patent
Luizzi et al.

(10) Patent No.: US 11,163,151 B2
(45) Date of Patent: Nov. 2, 2021

(54) ANISOTROPIC CONDUCTIVE ADHESIVE BOND IN A PIEZOELECTRIC MICRO-ELECTRO-MECHANICAL SYSTEM SCANNING MIRROR SYSTEM

(71) Applicant: MICROSOFT TECHNOLOGY LICENSING, LLC, Redmond, WA (US)

(72) Inventors: Joseph Michael Luizzi, Sammamish, WA (US); Michael James Nystrom, Mercer Island, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 230 days.

(21) Appl. No.: 16/415,917

(22) Filed: May 17, 2019

(65) Prior Publication Data
US 2020/0363631 A1 Nov. 19, 2020

(51) Int. Cl.
*G02B 26/08* (2006.01)
*G02B 26/10* (2006.01)
(Continued)

(52) U.S. Cl.
CPC ....... *G02B 26/0858* (2013.01); *G02B 26/101* (2013.01); *H02N 2/0085* (2013.01); *H02N 2/028* (2013.01)

(58) Field of Classification Search
None
See application file for complete search history.

(56) References Cited

U.S. PATENT DOCUMENTS 6,122,089 A * 9/2000 Minamoto ........... G02B 26/105
 359/198.1
7,852,546 B2 * 12/2010 Fijol ..................... G02B 26/02
 359/291
(Continued)

FOREIGN PATENT DOCUMENTS

JP 2003305842 A 10/2003
JP 2013003523 A 1/2013

OTHER PUBLICATIONS

"International Search Report and Written Opinion Issued in PCT Application No. PCT/US2020/027873", dated Jul. 29, 2020, 11 Pages.

*Primary Examiner* — Jennifer D. Carruth
(74) *Attorney, Agent, or Firm* — Shook, Hardy & Bacon, LLP

(57) ABSTRACT

A piezoelectric MEMS scanning mirror system is provided. In particular, the efficiency and life of the system are improved by use of new bonding methods. Mechanical and electrical connections between the actuator frame of a piezoelectric MEMS scanning mirror system and the piezoelectric actuators in the system may be created using an anisotropic conductive adhesive. An anisotropic conductive adhesive only conducts electricity across the bond line between a lower portion of the piezoelectric actuator and a top of the metal frame. One way this is done is to provide a sparse loading of conductive particles. When the piezoelectric element is compressed against the frame, the conductive particles only form a conductive path across the bond line. Grit blasting, sanding, or chemical etching may be used to roughen the metal surface prior to bonding. A surface roughness between 2 RMS and 6 RMS may be created on the metal frame.

18 Claims, 10 Drawing Sheets

(51) Int. Cl.
*H02N 2/00* (2006.01)
*H02N 2/02* (2006.01)

(56) References Cited

U.S. PATENT DOCUMENTS

| | | | |
|---|---|---|---|
| 9,777,197 B2* | 10/2017 | Khanna | H01L 24/29 |
| 10,203,475 B2* | 2/2019 | Balaban | H01F 7/081 |
| 10,712,550 B2* | 7/2020 | Champion | G02B 26/0833 |
| 10,739,554 B2* | 8/2020 | Kondo | B81C 1/00317 |
| 10,890,755 B2* | 1/2021 | Pu | G02B 26/0875 |
| 2005/0041278 A1* | 2/2005 | Matsuo | G02B 26/0841 |
| | | | 359/290 |
| 2009/0180167 A1 | 7/2009 | Tani et al. | |
| 2009/0185254 A1 | 7/2009 | Uchigaki et al. | |
| 2009/0243006 A1* | 10/2009 | Takahashi | B81B 3/0078 |
| | | | 257/415 |
| 2010/0103224 A1* | 4/2010 | Gerner | H01L 41/0973 |
| | | | 347/68 |
| 2015/0146312 A1* | 5/2015 | Gutierrez | G02B 27/646 |
| | | | 359/823 |
| 2017/0066240 A1* | 3/2017 | Hirai | B41J 2/1629 |
| 2017/0066241 A1* | 3/2017 | Naganuma | B41J 2/14233 |
| 2018/0269174 A1* | 9/2018 | Fathi | H01L 24/16 |
| 2019/0103373 A1* | 4/2019 | Hirai | H01L 25/162 |

* cited by examiner

ANISOTROPIC CONDUCTIVE ADHESIVE BOND IN A PIEZOELECTRIC MICRO-ELECTRO-MECHANICAL SYSTEM SCANNING MIRROR SYSTEM

BACKGROUND

In traditional piezoelectric micro-electro-mechanical system (MEMS) scanning mirror systems, a metal frame acts as the common mechanical and electrical connection for all of the piezoelectric elements. Various components of the system are bonded to the frame. These bonds represent potential failure points in the system. Improving the system bonds can improve the life of the piezoelectric MEMS scanning mirror systems.

In these devices, the frame serves as one electrical connection to the bottom electrode of the piezoelectric element, and a wire serves as the electrical connection to the top electrode of the piezoelectric element. The adhesive that forms the bond between the frame and the bottom electrode must have some electrical conductivity for the device to function. In a typical application, a conductive adhesive would be used. In addition, for efficient and uniform transfer of the mechanical force, adhesive must completely fill the bond line between the frame and the bottom electrode. One way of insuring a completely filled bond line is to apply excess adhesive and squeeze the excess adhesive out the sides of the bonds between the frame and the bottom electrode. However, with conductive adhesive, this excess adhesive that is squeezed out of the bond can end up shorting the top and bottom electrodes and preventing the application of an electric field across the piezoelectric element.

The piezoelectric MEMS scanning mirror assembly has a metal frame to couple the motion of the piezoelectric elements to the resonance scanning mirror structure. The bond between the metal frame and the MEMS resonance mirror is a highly stressed bond and critical to the performance of the device.

BRIEF SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

Aspects of the present invention relate to piezoelectric MEMS scanning mirror systems. In particular, the efficiency and life of the system are improved by use of new bonding methods. For example, aspects of the present invention relate to creating mechanical and electrical connections between the actuator frame of a piezoelectric MEMS scanning mirror system and the piezoelectric actuators in the system using an anisotropic conductive adhesive. An anisotropic conductive adhesive only conducts electricity across the bond line between a lower portion of the piezoelectric actuator and a top of the metal frame. One way this is done is to provide a sparse loading of conductive particles. When the piezoelectric element is compressed against the frame, the conductive particles only form a conductive path across the bond line. Adhesive that is squeezed out of the bond line is not compressed and does not have sufficient conductive material to form a path from the frame to the top electrode on the piezoelectric element. The result is a system with maximum mechanical and electrical performance and increased efficiency.

The bond between the metal frame and the MEMS resonance mirror is a highly stressed bond and critical to the performance of the device. The initial and long term strength of this bond may be improved by roughening the metal frame surface to increase the bond surface area. Grit blasting, sanding, or chemical etching may be used to roughen the metal surface prior to bonding. In one aspect, a surface roughness between 2 RMS and 6 RMS is created on the metal frame.

These and other aspects of the invention will become apparent to one of ordinary skill in the art upon a reading of the following description, drawings, and the claims.

BRIEF DESCRIPTION OF THE DRAWINGS

The present invention is described in detail herein with reference to the attached drawing figures, wherein.

DETAILED DESCRIPTION

Figure 1:
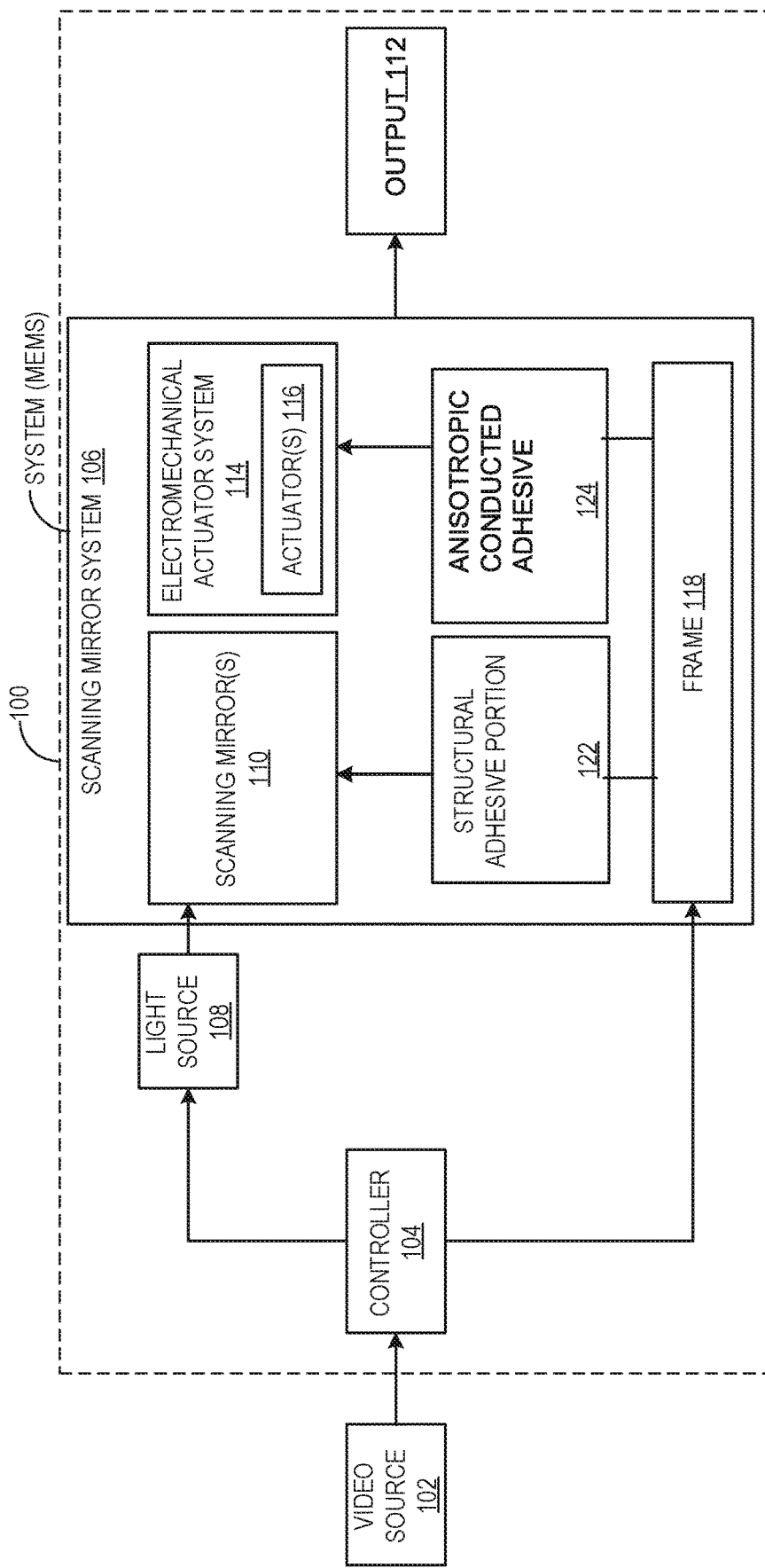
FIG. 1 shows a schematic view of an example display device that includes a MEMS bonded by structural adhesive interfaces, in accordance with aspects of the present disclosure.

The subject matter of the present disclosure is described with specificity herein to meet statutory requirements. However, the description itself is not intended to limit the scope of this patent. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described. As used herein, the singular forms "a," "an," and "the" are intended to include the plural forms as well, unless the context clearly indicates otherwise.

Aspects of the present invention relate to piezoelectric MEMS scanning mirror systems. In particular, the efficiency and life of the system are improved by use of new bonding methods. For example, aspects of the present invention relate to creating mechanical and electrical connections between the actuator frame of a piezoelectric MEMS scanning mirror system and the piezoelectric actuators in the system using an anisotropic conductive adhesive. An anisotropic conductive adhesive only conducts electricity across the bond line between a lower portion of the piezoelectric actuator and a top of the metal frame. One way this is done is to provide a sparse loading of conductive particles. When the piezoelectric element is compressed against the frame, the conductive particles only form a conductive path across the bond line. Adhesive that is squeezed out of the bond line is not compressed and does not have sufficient conductive material to form a path from the frame to the top electrode on the piezoelectric element. The result is a system with maximum mechanical and electrical performance and increased efficiency.

The bond between the metal frame and the MEMS resonance mirror is a highly stressed bond and critical to the performance of the device. The initial and long term strength of this bond may be improved by roughening the metal frame surface to increase the bond surface area. Grit blasting, sanding, or chemical etching may be used to roughen the metal surface prior to bonding. In one aspect, a surface roughness between 2 RMS and 6 RMS is created on the metal frame. This is in contrast to a native or untreated surface roughness of less than 1 RMS.

The technology described herein bonds the bottom electrode of the piezoelectric element onto the frame with an anisotropic conductive adhesive. Anisotropic conductive adhesives (ACAs) are a set of materials typically combining either epoxy or acryl adhesives and conductive particles to allow electrical connection across the bond. They differ from isotropic conductive adhesives, such as silver epoxy, in that the conductive particles are loaded and distributed in such a way that they do not conduct within the bulk of the adhesive but do conduct in the Z-axis when they are trapped between electrodes.

FIG. 1 schematically shows an example display device 100 in communication with a video source 102. Display device 100 includes a controller 104 operatively coupled to a scanning mirror system 106 and to a light source 108. Controller 104 is configured to control light source 108 to emit light based on video image data received from video source 102. Light source 108 may include any suitable light-emitting element(s), such as one or more lasers, and may output light in any suitable wavelength ranges, such as red, green, and blue. In other examples, light source 108 may output substantially monochromatic light or wavelength bands other than red/green/blue.

Scanning mirror system 106 comprises one or more scanning mirrors 110 controllable to vary an angle at which light from the light source is reflected to thereby scan an image. As mentioned above, the scanning mirror system 106 may include a single mirror driven in both horizontal and vertical directions or two mirrors separately driven in horizontal and vertical directions. Light reflected by scanning mirror system 106 is directed toward an output 112 for display of a scanned image. Output 112 may take any suitable form, such as projection optics, waveguide optics, etc. As examples, display device 100 may be configured as a virtual reality head-mounted display (HMD) device with output 112 configured as an opaque surface, or as an augmented reality HMD device with the output configured as a see-through structure that allows virtual imagery to be combined with a view of the surrounding real-world environment. Display device 100 also may assume other suitable forms, such as that of a head-up display, mobile device screen, monitor, or television, as examples.

Scanning mirror system 106 further includes an electromechanical actuator system 114 comprising actuator(s) 116 to affect movement of the scanning mirror(s) 110. Various types of actuators may be used to control a MEMS mirror system.

As illustrated in FIG. 1, one or more of the scanning mirror(s) 110 and the electromechanical actuator system 114 are bonded to an actuator frame 118. In one example, the structural adhesive interface 122 bonds the frame 118 to the scanning mirror 110. The top surface of the frame 118 and bottom surface of the scanning mirror 110 are roughened, according to the present technology described herein, to improve the structural bond.

The controller 104 may be configured to drive the actuator(s) 116 of the electromechanical actuator system 114 via electricity conducted through the actuator frame 118 and the anisotropic conductive adhesive 124 to the actuator(s) 116, which may also be described herein as piezoelectric elements.

Figure 2:
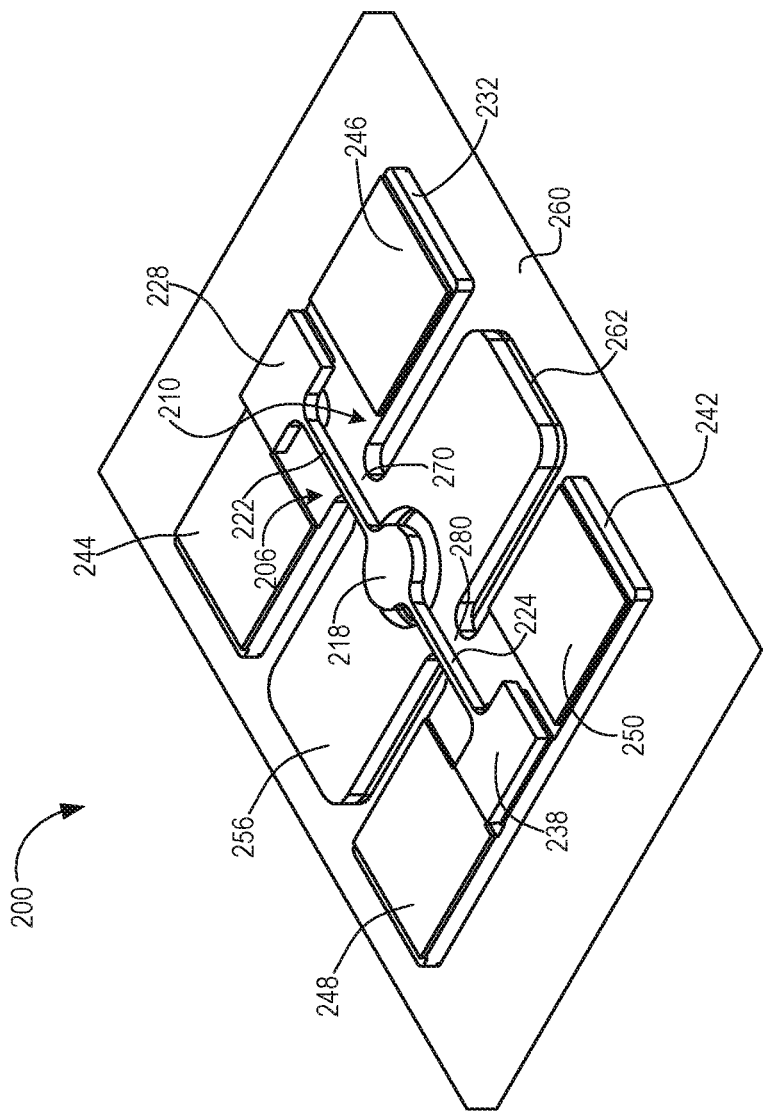
FIG. 2 shows an example scanning mirror system for the example display device of FIG. 1.
Figure 3:
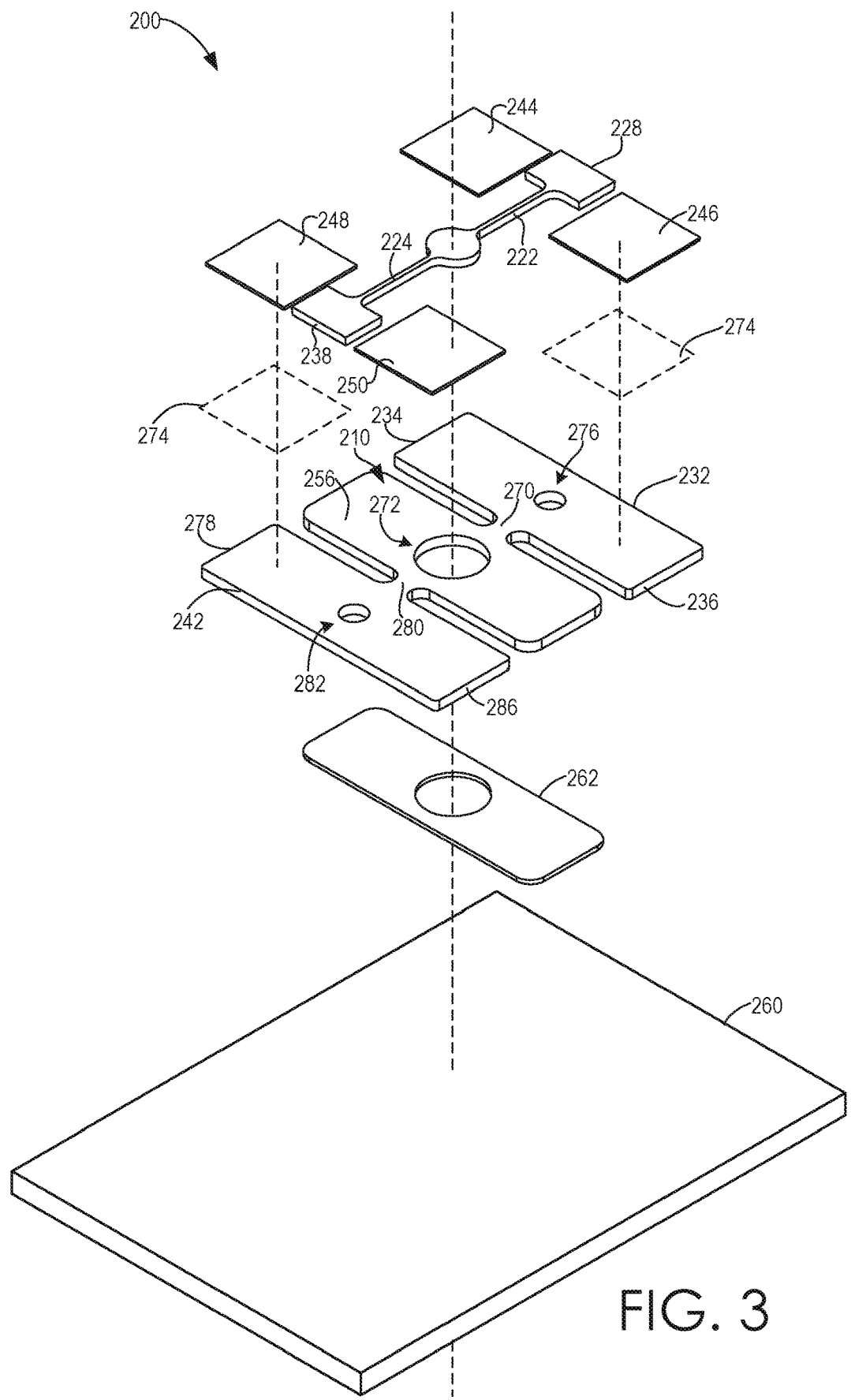
FIG. 3 shows an exploded view of the scanning mirror system of FIG. 2.
Figure 4:
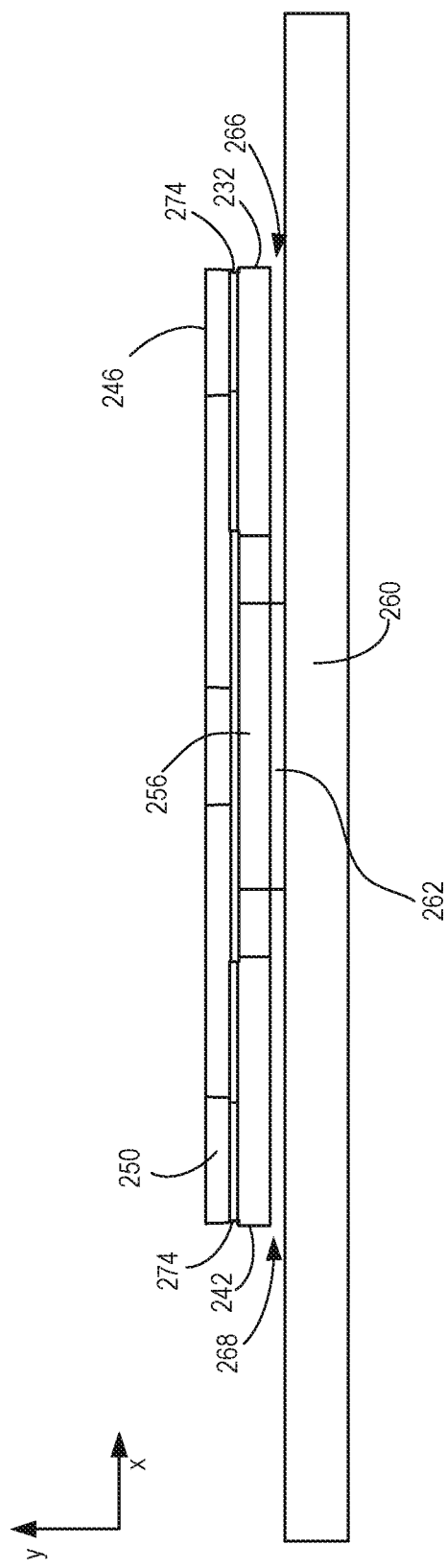
FIG. 4 shows a side view of the scanning mirror system of FIG. 2.

FIGS. 2-4 show a specific example of a scanning mirror system 200 that includes a scanning mirror assembly 206 comprising an example of an actuator frame 210. Scanning mirror assembly 206 comprises a MEMS mirror 218 attached to the actuator frame 210 via a first flexure 222 and a second flexure 224. First and second flexures 222 and 224 may provide respective pivots via which mirror 218 can rotate and thereby change its angular orientation to vary the angle at which light from a light source is reflected. Mirror 218 may scan in a horizontal or vertical direction, depending upon an orientation in which scanning mirror system 200 is incorporated into a display device.

The first flexure 222 of scanning mirror assembly 206 is connected to a first anchor portion 228. This first anchor portion is affixed to a first moveable member 232 of the actuator frame 210 by a structural adhesive interface. In a similar manner, the second flexure 224 of scanning mirror assembly 206 is connected to a second anchor portion 238 that is affixed to a second moveable member 242 of the actuator frame 210 by a structural adhesive interface. As described in more detail below, actuators affixed to the moveable members are controlled to cause corresponding movement in the mirror 218.

In this example, the scanning mirror system 200 includes an electromechanical actuator system comprising a first actuator pair affixed to the first moveable member 232 adjacent to the first flexure 222, and a second actuator pair affixed to the second moveable member 242 adjacent to the second flexure 224. The first actuator pair comprises first actuator 244 and second actuator 246, and the second actuator pair comprises third actuator 248 and fourth actuator 250.

The actuators may be controlled to cause a desired oscillation in the mirror 218. For example, the actuators may comprise a lead zirconate titanate (PZT) material or piezoelectric ceramic material that changes dimension based upon an applied voltage. For example, upon receiving an electrical signal having a first polarity (e.g., positive), actuators 244 and 248 may apply a contractive force to portions of moveable members 232 and 242, respectively, underlying these actuators. On the other hand, upon receiving the electric signal having the first polarity, actuators 246 and 250 may apply a dilative force to portions of moveable members 232 and 242, respectively, underlying these actuators. An electrical signal having a second, different polarity (e.g., negative) may cause actuators 244 and 248 to apply a dilative force to the respective underlying portions of the moveable members, and may cause actuators 246 and 250 to apply a contractive force to the respective underlying portions of the moveable members 232 and 242. The magnitude of force applied by actuators 244, 246, 248, and 250 may be controlled by controlling the magnitude of an electrical signal applied to the actuators. As discussed above, the electrical signal applied to the actuators may be conducted through the conductive structural adhesive portion 124 of the structural adhesive interface 120 bonding each actuator to respective underlying portions of the moveable members 232 and 242. In this manner, the electrical signal may be applied to the conductive material of the actuator frame 210 and conducted to each of the actuators 244, 246, 248, and 250 via the conductive structural adhesive portion 124.

In other examples, the electromechanical actuator system of scanning mirror system 200 may utilize any suitable type of actuators. For example, each actuator may comprise a magnetic actuator, wherein a magnetic force between magnetic elements can be varied via electrical signal. In other examples, each actuator may comprise an electrostatic actuator, where an electric field between electrodes can be varied to adjust contractive or dilative forces. As a further example, each electromechanical actuator may utilize one or more bimetallic strips, where differing coefficients of thermal expansion of different materials can be leveraged to vary the applied forces. It will also be appreciated that actuator(s) of an electromechanical actuator system may be arranged at other suitable locations in a scanning mirror system.

In this example, a central mounting member 256 of the actuator frame 210 is affixed to an underlying substrate 260 via a spacer 262. In some examples the actuator frame 210 may comprise a metallic material, such as steel, and the substrate 260 may comprise a PCB, ceramic material, or any other suitable material. The spacer 262 may comprise any suitable metallic material, such as steel. The central mounting member 256 may be bonded to the spacer 262, and the spacer bonded to the substrate 260 via the structural adhesive interface 120, such that an electric signal may be conducted from the substrate 260 to the actuators 244, 246, 248, and 250.

In the example of FIGS. 2-4, spacer 262 elevates the actuator frame 210 above the substrate 260 to thereby enable movement of the moveable members 232 and 242. More particularly and as shown in FIG. 4, spacer 262 creates gaps 266 and 268 between moveable members 232 and 242, respectively, and the underlying substrate 260. In this manner, the first moveable member 232 and the second moveable member 242 float above the substrate 260, and thereby may cause movement of the mirror 218 via flexures 222 and 224. In one example, each of the gaps 266 and 268 may be approximately 0.4 mm to 0.6 mm, or more specifically 0.5 mm, to enable y-axis movement of the first moveable member 232 and second moveable member 242 relative to the substrate 260. In other examples, any other suitable gap distances may be utilized to accommodate different scanning mirror system configurations and desired mirror movements. In the present example, the spacer 262 has substantially the same shape as the mounting member 256 of the actuator frame 210. In other examples, the spacer 262 may have a shape different from the mounting member 256. As shown in FIG. 3, the actuators 244, 246, 248, and 250 are bonded to respective underlying portions of the moveable members 232 and 242 of the actuator frame 210 by an anisotropic conductive adhesive 274.

As illustrated in FIG. 3, the actuator frame 210 comprises a first hinge 270 that connects a central portion 272 of the mounting member 256 with a central portion 276 of the first moveable member 232. In this example, the first hinge 270 is located substantially equidistant from the opposing ends 234 and 236 of the first moveable member 232. Similarly, the central portion 276 of the first moveable member 232 is located substantially midway between the opposing ends 234 and 236 of the first moveable member. In this example, both central portion 272 and central portion 276 comprise an aperture. It will be appreciated that in other examples, the mounting member 256 and first moveable member 232 may have different configurations that include one or more apertures of different shapes, sizes, and/or locations, or configurations that include no apertures.

In a similar manner, actuator frame 210 comprises a second hinge 280 that connects central portion 272 of the mounting member 256 with a central portion 282 of the second moveable member 242. As with the first hinge 270, the second hinge 280 is located substantially equidistant from the opposing ends 278 and 286 of the second moveable member 242. The central portion 282 of the second moveable member 242 is also located substantially midway between the opposing ends 278 and 286 of the second moveable member. In this example, both central portion 272 and central portion 282 comprise an aperture. As with the first moveable member 232, in other examples the mounting member 256 and second moveable member 242 may have different configurations that include apertures of different shapes, sizes, and/or locations, or configurations that include no apertures. In some examples, actuator frame 210 may be formed from micromachined silicon dies.

As illustrated in FIG. 3, each of the actuators 244, 246, 248, and 250 may be bonded to respective underlying portions of the moveable members 232 and 242 of the actuator frame 210 by anisotropic conductive adhesive 274. In one example, the anchor portion 228 and 238 connected to the mirror 218 may also be bonded to underlying portions of the moveable members 232 and 242 by structural adhesive.

Figure 5:
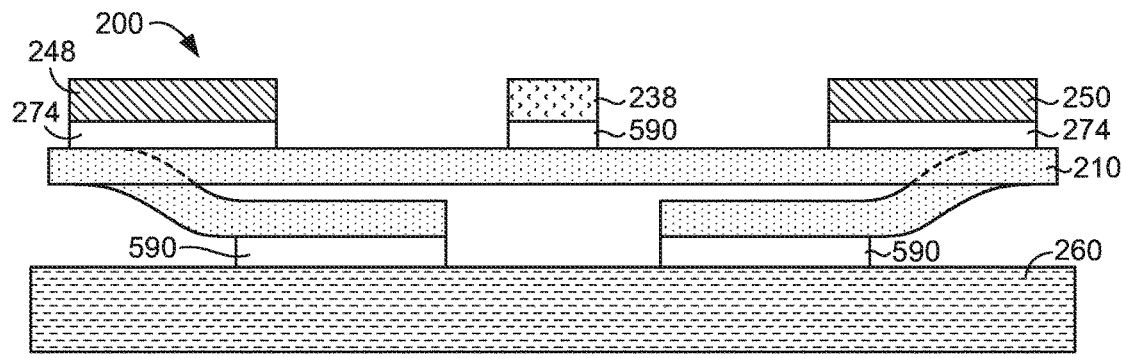
FIG. 5 is a side elevation of a scanning mirror system, in accordance with aspects of the present disclosure.

Referring now to FIG. 5, a side elevation of a scanning mirror system 200 is illustrated, in accordance with aspects hereof. Some components referenced in FIGS. 2-4 are not depicted in FIGS. 5-11 to more clearly emphasize particular aspects of the present disclosure. Although each of FIGS. 5-11 depict certain components, it will be appreciated that in various aspects of the present disclosure, the scanning mirror system may have different configurations that include one or more components described herein in different shapes, sizes, and/or locations (e.g., a different shaped actuator frame), or different configurations that include or exclude some of these components. As illustrated, the bottom surface of an actuator frame 210 is attached to a substrate 260 with adhesive. In aspects, the actuator frame 210 is made of a frame material that has a thermal expansion matched to a mirror. For example, the frame material may be alloy 42. The actuator frame 210 may be coated with a coating (e.g., electroless nickel immersion gold coating or electroless nickel electroless palladium immersion gold coating). The coating enables a surface of the actuator frame 210 to be compatible with wire bonding that would not otherwise be wire bondable.

The scanning mirror system 200 also includes actuators 248 and 250. The actuator(s) 248, 250 has a top electrode on the top surface and a bottom electrode on the bottom surface and is attached to a top surface of the actuator frame 210 with an anisotropic conductive adhesive 274. In this way, the bottom electrode of the actuator 248, 250 is electrically connected to the top surface of the actuator frame 210.

A mirror extends across a gap in a central mounting member of the actuator frame 210. Anchor portions 228, 238 of the mirror are attached to the top surface of the actuator frame 210 with a structural adhesive 590. The anchor portion may be silicon.

Figure 6:
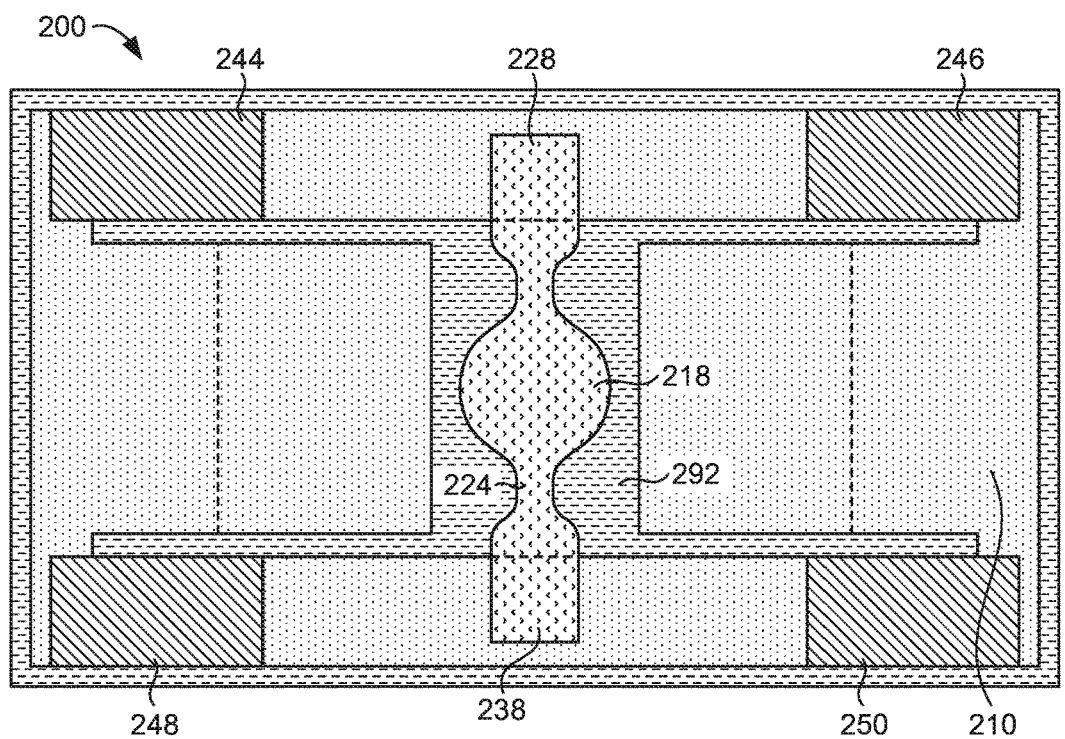
FIG. 6 is a top plan view of a scanning mirror system, in accordance with aspects of the present disclosure.

FIG. 6 is a top elevation of a scanning mirror system 200, in accordance with aspects hereof. As illustrated, the scanning mirror system 200 includes four actuators 244, 246, 248, 250. As described above, each of the actuators 244, 246, 248, 250 has a top electrode on the top surface and a bottom electrode on the bottom surface and is attached to a top surface of the actuator frame 210 with an adhesive (not shown in FIG. 6). The top electrode of each of the actuators 244, 246, 248, 250 may be wire bonded (not shown) to an electrical pad (not shown) on the substrate 260. The wire bonds enable the electrical connection between the top surface of each of the actuators 244, 246, 248, 250 and the substrate 260.

As described above, a mirror 218 extends across an aperture 292 in a middle of the actuator frame 210. Anchor portions 228, 238 of the mirror 218 are attached to the top surface of the actuator frame 210 with a structural adhesive (not shown in FIG. 6) and are connected to the mirror 218 by first flexure 222 and second flexure 224.

Figure 7:
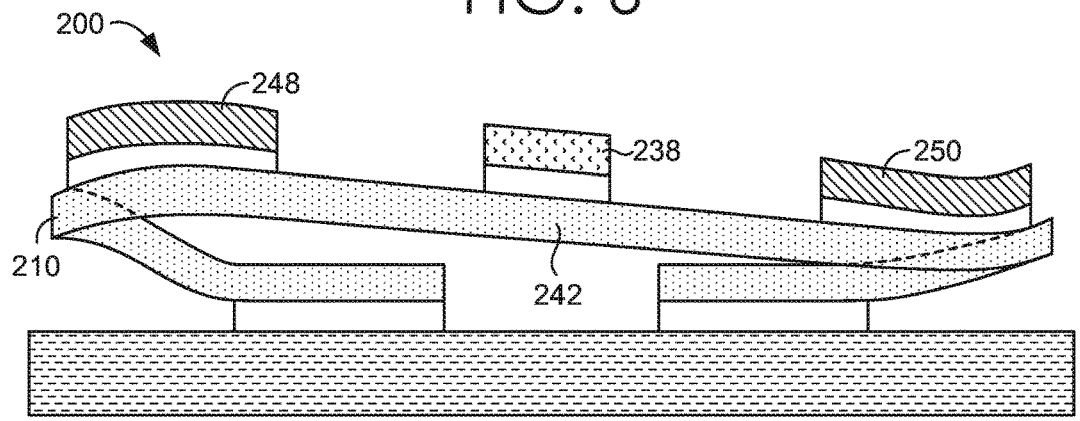
FIG. 7 is a side elevation illustrating movement of a scanning mirror system, in accordance with aspects of the present disclosure.

FIG. 7 depicts a side elevation illustrating movement of a scanning mirror system 200, in accordance with aspects hereof. The movement of the scanning mirror system 200 in FIG. 7 is exaggerated for illustrative purposes. For clarity, the piezoelectric effect is the ability of certain materials to generate an electric charge in response to applied mechanical stress. Conversely, when an electric field is applied to these materials, the materials become stressed and can shrink or expand.

In the context of the scanning mirror system 200 described herein, when an electric field is applied across an actuator 248, 250 in the Z direction, the actuators 248, 250 attempt to shrink or expand in the X and Y direction. Since the actuators 248, 250 are constrained by the actuator frame 210 (i.e., the actuator frame attempts to keep the actuator 248, 250 the same size), the actuators 248, 250 curve. In the case where an actuator on one side of the actuator frame 210 attempts to shrink (e.g., the actuator 248) and an actuator on the other side of the actuator frame 210 attempts to expand (e.g., the actuator 250), the actuators 248, 250 curve in opposite directions, causing the second moveable member 242 of the actuator frame 210 to tilt slightly. Since the anchor portion 238 of the mirror 218 is attached to the second moveable member 242, the tilting of the anchor portion 238 causes movement of the mirror 218 via the flexure(s) (not shown in FIG. 7) at a much higher degree.

Figure 8:
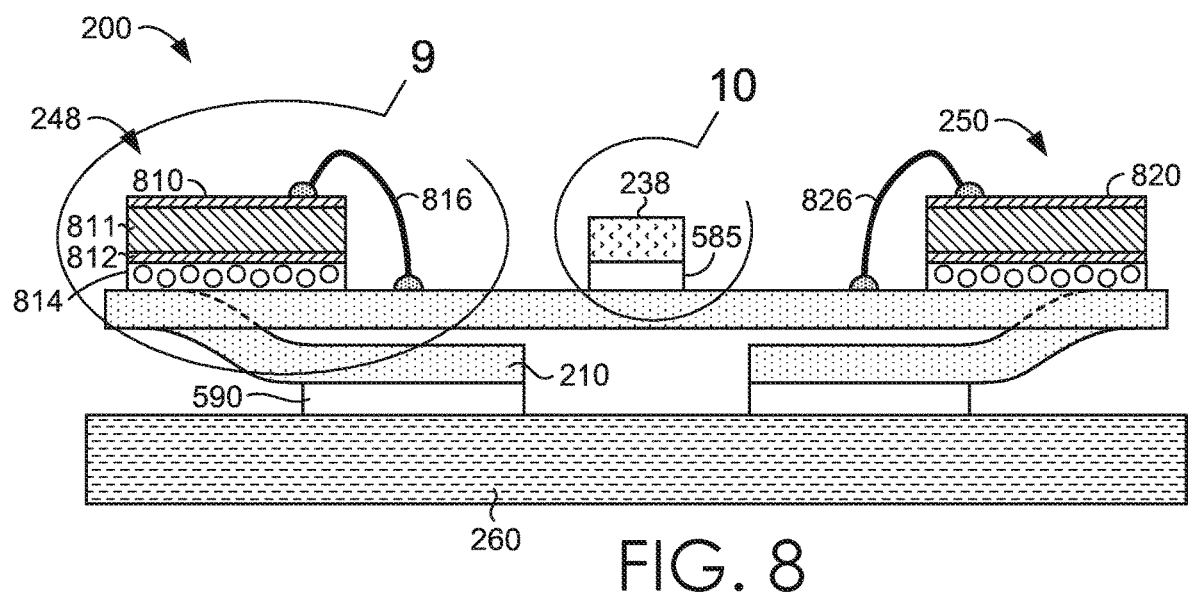
FIG. 8 is a side elevation of an exemplary scanning mirror system, in accordance with aspects of the present disclosure.

Referring now to FIG. 8, a side elevation of an exemplary wire bonded common electrical connection in a scanning mirror system 200 is illustrated, in accordance with aspects hereof. As illustrated, the scanning mirror system 200 includes a first wire bond 816 between a first top electrode 810 of the third actuator 248 and a top surface of the actuator frame 210. The third actuator 248 comprises a first top electrode 810, a first piezoelectric element 811, and a first bottom electrode 812. The first bottom electrode 812 is connected to the actuator frame 210 via an anisotropic conductive adhesive 814.

The system also includes a second wire bond 826 between the top surface of the actuator frame 210 and a second top electrode 820 of the fourth actuator 250.

As illustrated, the bottom surface of an actuator frame 210 is attached to a substrate 260 with an adhesive 590. The actuator frame 210 is coated with a coating (e.g., electroless nickel immersion gold coating or electroless nickel electroless palladium immersion gold coating). The coating enables a surface of the actuator frame 210 to be compatible with wire bonding that would not otherwise be wire bondable.

FIG. 8 also shows a side view of the second anchor portion 238 of the scanning mirror connected to the top surface of the actuator frame 210 via adhesive 585. Adhesive 585 may be similar to or different from the adhesive 590. However, it need not be an anisotropic conductive adhesive.

Figure 9:
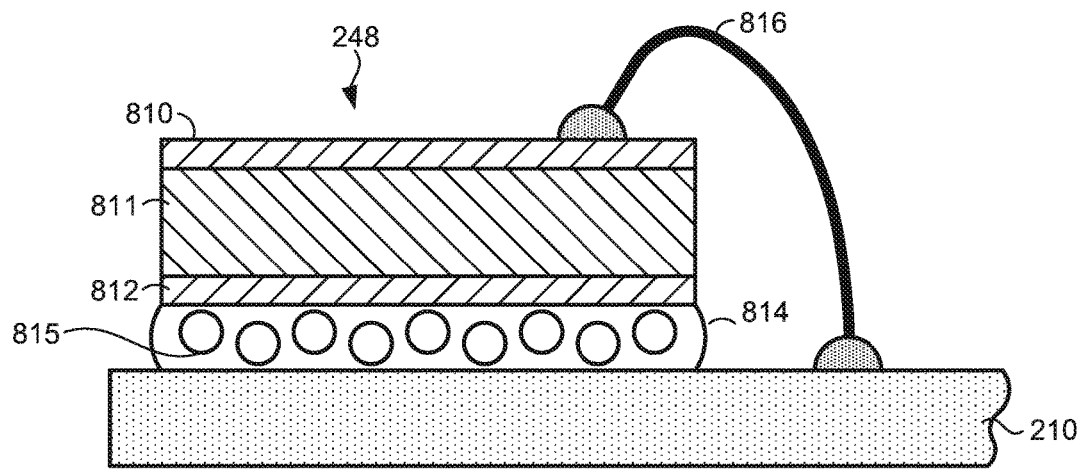
FIG. 9 is a side elevation of a piezoelectric actuator connected to an actuator frame with a precise amount of anisotropic conductive adhesive, in accordance with aspects of the present disclosure.

Turning now to FIG. 9, a side elevation of a piezoelectric actuator connected to an actuator frame with a precise amount of anisotropic conductive adhesive 814 is provided, in accordance with aspects of the present disclosure. The precise amount is provided when the anisotropic conductive adhesive 814 extends across the entire bottom surface of the first bottom electrode 812 without extending substantially past either edge of the first bottom electrode 812. The compression of the anisotropic conductive adhesive 814 between components causes the conductive elements 815 to align in contact with one another and form a conductive circuit between the actuator frame 210 and the first bottom electrode 812.

Figure 10:
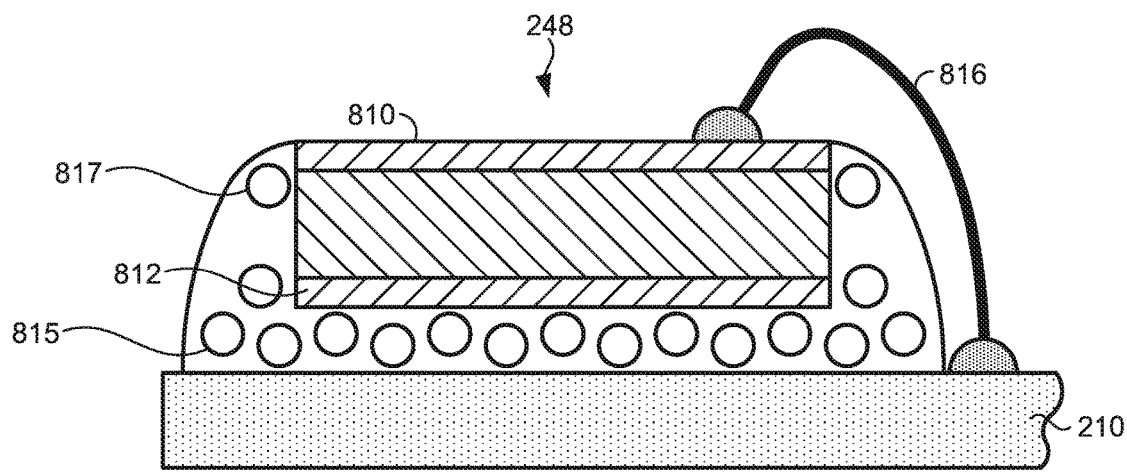
FIG. 10 is a side elevation of a piezoelectric actuator connected to an actuator frame with an excessive amount of anisotropic conductive adhesive, in accordance with aspects of the present disclosure.

Turning now to FIG. 10, a side elevation of a piezoelectric actuator connected to an actuator frame with an excessive amount of anisotropic conductive adhesive is provided, in accordance with aspects of the present disclosure. An excessive amount is provided when the anisotropic conductive adhesive 814 extends across the entire bottom surface of the first bottom electrode 812 and extends substantially past either edge of the first bottom electrode 812. The compression of the anisotropic conductive adhesive 814 between components causes the conductive elements 815 to align in contact with one another and form a conductive circuit between the actuator frame 210 and the first bottom electrode 812. The conductive elements (e.g., element 817) in the non-compressed portion of the anisotropic conductive adhesive 814 are not in contact with other elements, thus this portion of the anisotropic conductive adhesive 814 will not conduct electricity. If the adhesive were conductive in this portion, then the top electrode 810 and bottom electrode 812 would be electrically connected to each other causing the third actuator 248 to fail. The use of anisotropic conductive adhesive 814 enables a workable actuator to be built when excessive adhesive is used.

Figure 11:
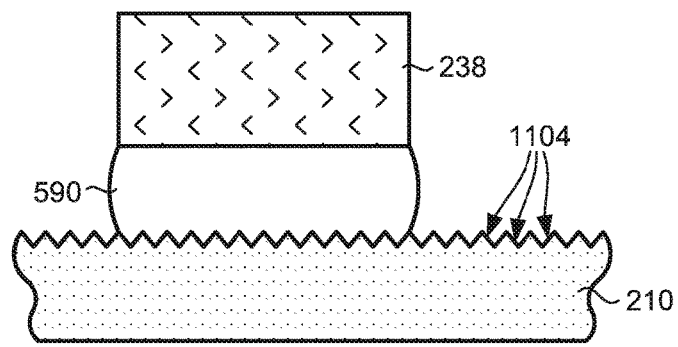
FIG. 11 is a side elevation of an exemplary roughened frame surface, in accordance with aspects of the present disclosure.

Turning now to FIG. 11, a side elevation of an exemplary roughened frame surface is provided, in accordance with aspects of the present disclosure. As can be seen, the top surface of the actuator frame 210 is roughened 1104. The roughened surface improves adhesion to the top surface of the actuator frame 210 by increasing surface area. Note that the second anchor portion 238 of the scanning mirror is not roughened, in this example.

Figure 12:
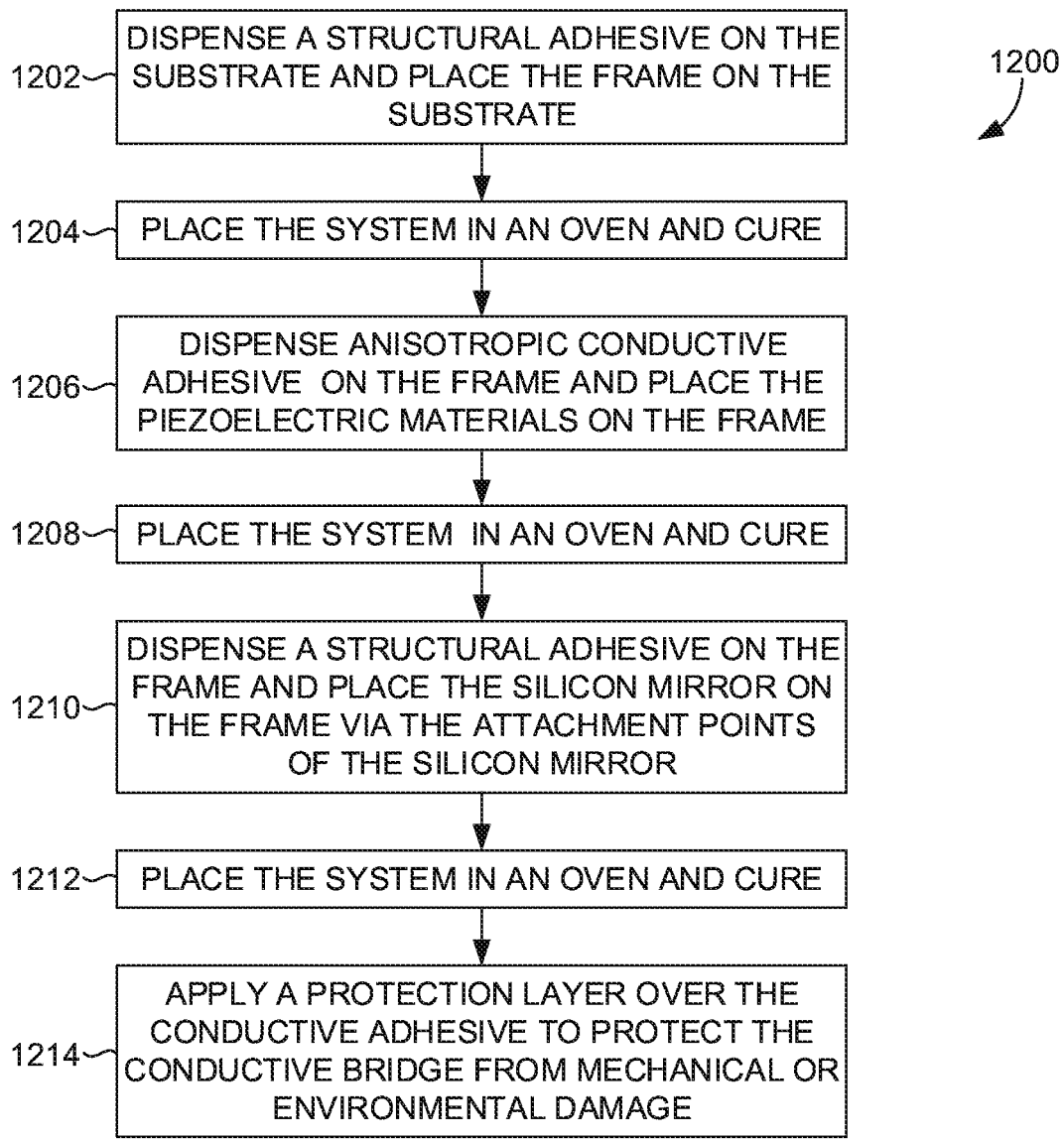
FIG. 12 shows an example method for building a piezoelectric MEMS scanning mirror systems using anisotropic conductive adhesive to bond the actuator frame to the piezoelectric actuator, in accordance with aspects of the present disclosure.

FIG. 12 depicts a flow chart illustrating a method 1200 of building a MEMS scanning mirror system. Although the method is presented in a particular order, it should be appreciated that the method can be performed in a variety of orders. At step 1202, a structural adhesive is dispensed on the substrate and the actuator frame is placed on the substrate. The system is placed in an oven and cured, at step 1204. An anisotropic conductive adhesive is dispensed on the actuator frame, at step 1206, and the actuators are placed on the actuator frame. The system is placed in an oven and cured, at step 1208. A structural adhesive is dispensed on the actuator frame, at step 1210, and the mirror is placed on the actuator frame via the anchor portions of the mirror. At step 1212, the system is placed in an oven and cured. A protection layer is applied over the conductive adhesive, at step 1214, to protect the conductive bridge from mechanical or environmental damage.

Method 1200 may also include improving the physical bond by roughening the top surface of the actuator frame. The bond between the metal frame and the MEMS resonance mirror is a highly stressed bond and critical to the performance of the device. The initial and long term strength of this bond may be improved by roughening the metal frame surface to increase the bond surface area. Grit blasting, sanding, or chemical etching may be used to roughen the metal surface prior to bonding. In one aspect, a surface roughness between 2 RMS and 6 RMS is created on the metal frame. This is in contrast to a native or untreated surface roughness of less than 1 RMS. In one aspect, the entire top surface of the actuator frame is roughened. In another aspect, only a portion of the frame that will be bonded to the mirror or other component is roughened.

Figure 13:
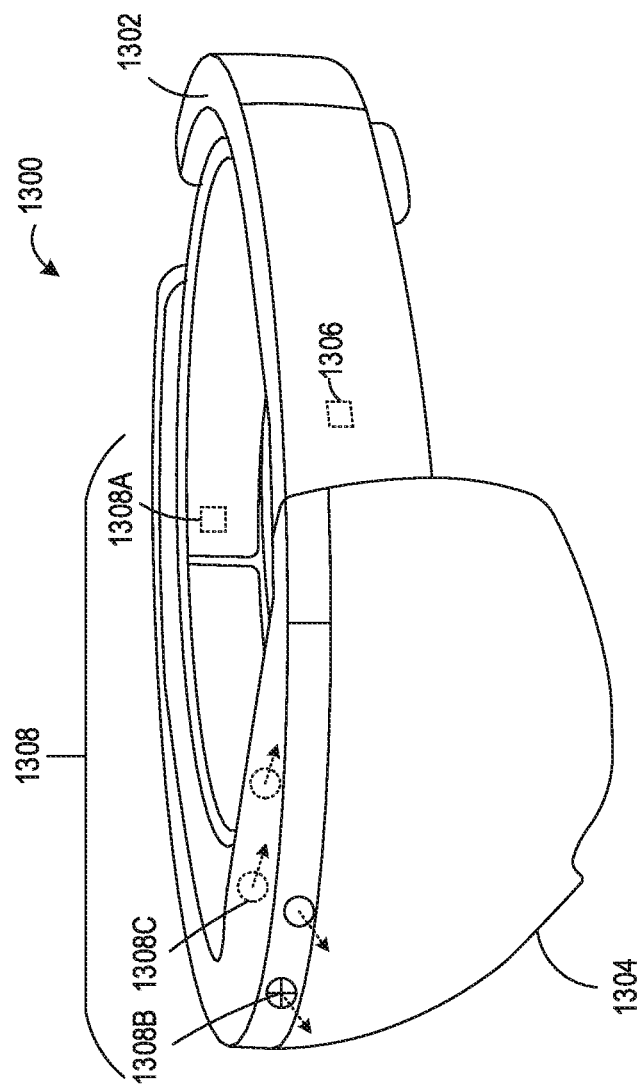
FIG. 13 shows a side perspective view of a computing device in the form of a head mounted display (HMD) device that includes the example display device of FIG. 1.

FIG. 13 shows an example head mounted display (HMD) device 1300 that may include the example display device 100 illustrated in FIG. 1 and the example scanning mirror system 200 illustrated in FIGS. 3-5. The HMD device 1300 may be worn by a user according to an example of the present disclosure. In other examples, an HMD device may take other suitable forms in which an at least partially see-through display is supported in front of a viewer's eye or eyes in an augmented reality HMD device configuration.

In the example of FIG. 13, the HMD device 1300 includes a frame 1302 that wraps around the head of the user to position a display device 1304 close to the user's eyes. The display device 1304, may, for example, take the form of the example display device 100 illustrated in FIG. 1 and described above. The frame supports additional components of the HMD device 1300, such as, for example, a processor 1306 and input devices 1308. The processor 1306 includes logic and associated computer memory configured to provide image signals to the display device 1304, to receive sensory signals from input devices 1308, and to enact various control processes described herein. The processor 1306 may take the form of the controller 104 illustrated in FIG. 1.

The input devices 1308 may include various sensors and related systems to provide information to the processor 1306. Such sensors may include, but are not limited to, an inertial measurement unit (IMU) 1308A, one or more outward facing image sensors 1308B, and one or more inward facing image sensors 1308C. The one or more inward facing image sensors 1308C may be configured to acquire image data in the form of gaze tracking data from a wearer's eyes.

The one or more outward facing image sensors 1308B may be configured to capture and/or measure physical environment attributes of the physical environment in which the HMD device 1300 is located. In one example, outward facing image sensors 1308B may include a visible-light camera configured to collect a visible-light image of a physical space. Further, the one or more outward facing image sensors 1308B may include a depth camera configured to collect a depth image of a physical space. More particularly, in one example, the depth camera is an infrared time-of-flight depth camera. In another example, the depth camera is an infrared structured light depth camera.

Data from the outward facing image sensors 1308B may be used by the processor 1306 to generate and/or update a three-dimensional (3D) model of the physical space. Data from the outward facing image sensors 1308B may be used by the processor 1306 to identify surfaces of the physical space and/or measure one or more surface parameters of the physical space. The processor 1306 may execute instructions to generate/update virtual scenes displayed on display device 1304 and identify surfaces of the physical space in any suitable manner.

In augmented reality configurations of HMD device 1300, the position and/or orientation of the HMD device 1300 relative to the physical environment may be assessed so that augmented-reality images may be accurately displayed in desired real-world locations with desired orientations. As noted above, the processor 806 may execute instructions to generate a 3D model of the physical environment including surface reconstruction information that may be used to identify surfaces in the physical space. In both augmented reality and non-augmented reality configurations of HMD device 1300, the IMU 1308A of HMD device 1300 may be configured to provide position and/or orientation data of the HMD device 1300 to the processor 1306.

In some embodiments, the methods and processes described herein may be tied to a computing system of one or more computing devices. In particular, such methods and processes may be implemented as a computer-application program or service, an application-programming interface (API), a library, and/or other computer-program product.

Figure 14:
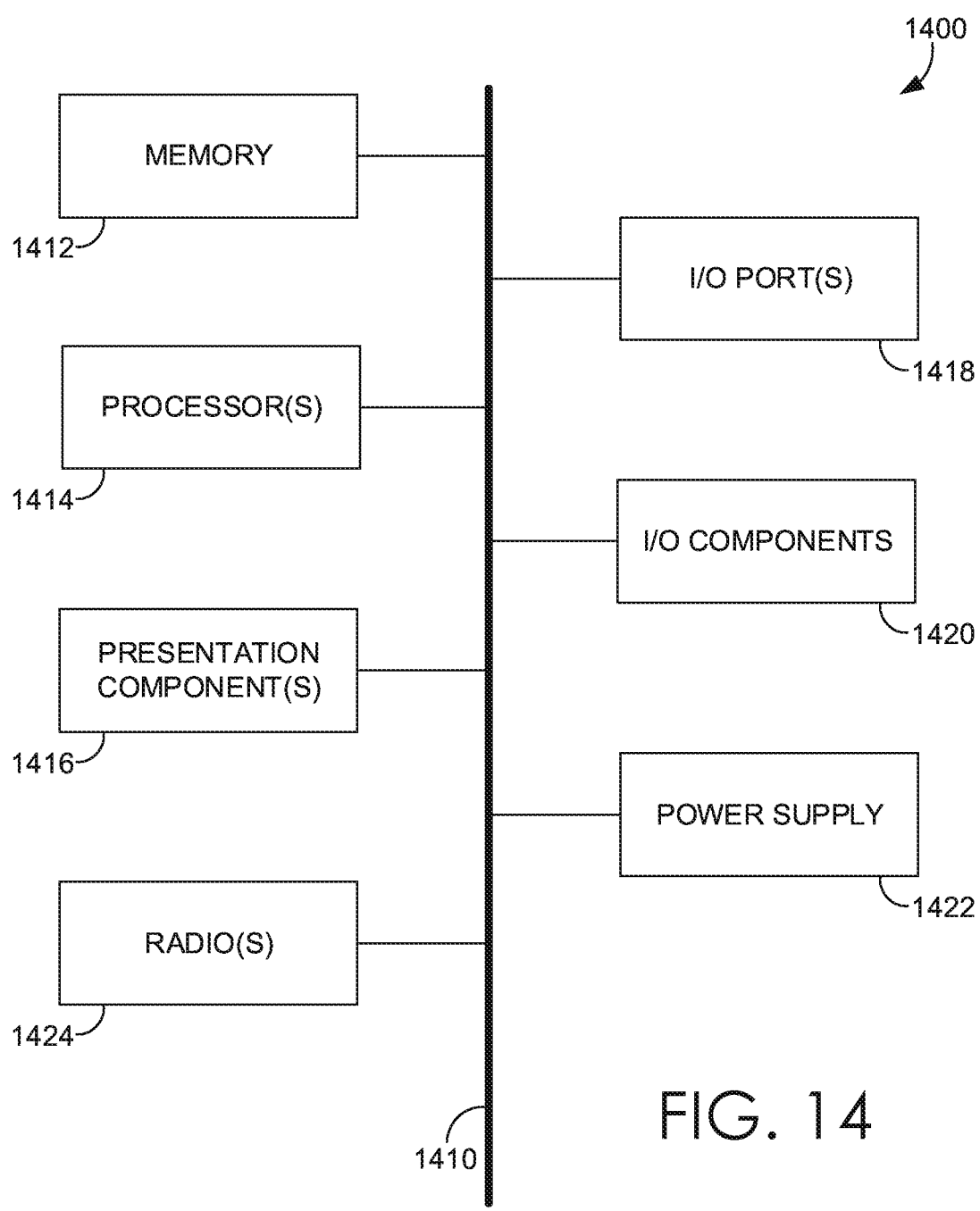
FIG. 14 is a block diagram that illustrates an exemplary computing device.

With reference to FIG. 14, computing device 1400 includes a bus 1410 that directly or indirectly couples the following devices: memory 1412, one or more processors 1414, one or more presentation components 1416, one or more input/output (I/O) ports 1418, one or more I/O components 1420, and an illustrative power supply 1422. Bus 1410 represents what may be one or more busses (such as an address bus, data bus, or combination thereof). Although the various blocks of FIG. 14 are shown with lines for the sake of clarity, in reality, these blocks represent logical, not necessarily actual, components. For example, one may consider a presentation component such as a display device to be an I/O component. Also, processors have memory. The inventors hereof recognize that such is the nature of the art and reiterate that the diagram of FIG. 14 is merely illustrative of an exemplary computing device that can be used in connection with one or more aspects of the present technology. Distinction is not made between such categories as "workstation," "server," "laptop," "handheld device," etc., as all are contemplated within the scope of FIG. 14 and with reference to "computing device."

Computing device 1400 typically includes a variety of computer-readable media. Computer-readable media can be any available media that can be accessed by computing device 1400 and includes both volatile and nonvolatile media, removable and non-removable media. By way of example, and not limitation, computer-readable media may comprise computer-storage media and communication media.

Computer-storage media includes both volatile and nonvolatile, removable and non-removable media implemented in any method or technology for storage of information such as computer-readable instructions, data structures, program modules, or other data. Computer storage media includes, but is not limited to, RAM, ROM, EEPROM, flash memory or other memory technology, CD-ROM, digital versatile disks (DVDs) or other optical disk storage, magnetic cassettes, magnetic tape, magnetic disk storage or other magnetic storage devices, or any other medium which can be used to store the desired information and which can be accessed by computing device 1400. Computer storage media does not comprise signals per se.

Communication media typically embodies computer-readable instructions, data structures, program modules, or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media, such as a wired network or direct-wired connection, and wireless media, such as acoustic, RF, infrared, and other wireless media. Combinations of any of the above should also be included within the scope of computer-readable media.

Memory 1412 includes computer storage media in the form of volatile and/or nonvolatile memory. The memory may be removable, non-removable, or a combination thereof. Exemplary hardware devices include solid-state memory, hard drives, optical-disc drives, etc. Computing device 800 includes one or more processors 1414 that read data from various entities such as memory 1412 or I/O components 1420. Presentation component(s) 1416 presents data indications to a user or other device. Exemplary presentation components include a display device, speaker, printing component, vibrating component, and the like.

The I/O ports 1418 allow computing device 1400 to be logically coupled to other devices, including I/O components 1420, some of which may be built in. Illustrative components include a microphone, joystick, game pad, satellite dish, scanner, printer, wireless device, etc.

The I/O components 1420 may provide a natural user interface (NUI) that processes air gestures, voice, or other physiological inputs generated by a user. In some instances, inputs may be transmitted to an appropriate network element for further processing. An NUI may implement any combination of speech recognition, touch and stylus recognition, facial recognition, biometric recognition, gesture recognition both on screen and adjacent to the screen, air gestures, head and eye tracking, and touch recognition associated with displays on the computing device 1400. The computing device 1400 may be equipped with depth cameras, such as stereoscopic camera systems, infrared camera systems, RGB camera systems, and combinations of these, for gesture detection and recognition. Additionally, the computing device 1400 may be equipped with accelerometers or gyroscopes that enable detection of motion. The output of the accelerometers or gyroscopes may be provided to the display of the computing device 1400 to render immersive augmented reality or virtual reality.

Some aspects of computing device 1400 may include one or more radio(s) 1424 (or similar wireless communication components). The radio 1424 transmits and receives radio or wireless communications. The computing device 1400 may be a wireless terminal adapted to receive communications and media over various wireless networks. Computing device 1400 may communicate via wireless protocols, such as code division multiple access ("CDMA"), global system for mobiles ("GSM"), or time division multiple access ("TDMA"), as well as others, to communicate with other devices. The radio communications may be a short-range connection, a long-range connection, or a combination of both a short-range and a long-range wireless telecommunications connection. When we refer to "short" and "long" types of connections, we do not mean to refer to the spatial relation between two devices. Instead, we are generally referring to short range and long range as different categories, or types, of connections (i.e., a primary connection and a secondary connection). A short-range connection may include, by way of example and not limitation, a Wi-Fi® connection to a device (e.g., mobile hotspot) that provides access to a wireless communications network, such as a WLAN connection using the 802.11 protocol; a Bluetooth connection to another computing device is a second example of a short-range connection, or a near-field communication connection. A long-range connection may include a connection using, by way of example and not limitation, one or more of CDMA, GPRS, GSM, TDMA, and 802.16 protocols.

It will be understood that certain features and subcombinations are of utility and may be employed without reference to other features and subcombinations. This is contemplated by and is within the scope of the claims.

While specific elements and steps are discussed in connection to one another, it is understood that any element and/or steps provided herein is contemplated as being combinable with any other elements and/or steps regardless of explicit provision of the same while still being within the scope provided herein. Since many possible embodiments may be made of the disclosure without departing from the scope thereof, it is to be understood that all matter herein set forth or shown in the accompanying drawings is to be interpreted as illustrative and not in a limiting sense.

The invention claimed is:

1. A piezoelectric micro-electro-mechanical system (MEMS) scanning mirror system comprising:
    an actuator frame comprising an electrically conductive material;
    a piezoelectric actuator having a top electrode on a top surface of the piezoelectric actuator and a bottom electrode on a bottom surface of the piezoelectric actuator;
    an anisotropic conductive adhesive layer between the bottom electrode of the piezoelectric actuator and a top surface of the actuator frame, wherein a conductive layer on the bottom surface of the piezoelectric actuator is electrically connected to the top surface of the actuator frame by the anisotropic conductive adhesive, and wherein the anisotropic conductive adhesive only conducts electricity in a direction perpendicular to the top surface of the actuator frame; and
    a mirror assembly extending across a gap in a central mounting member of the actuator frame and attached with a structural adhesive via anchor portions of the mirror assembly to the top surface of the actuator frame.

2. The system of claim 1, wherein the top surface of the actuator frame has a surface roughness greater than 2.2 RMS.

3. The system of claim 1, wherein the top surface of the actuator frame has a surface roughness greater than 3 RMS.

4. The system of claim 1, wherein the top surface of the actuator frame has a surface roughness greater than 5 RMS.

5. The system of claim 1, wherein the top surface of the actuator frame has a surface roughness between 2 RMS and 6 RMS.

6. The system of claim 1, wherein the top surface of the actuator frame comprises a material with a surface roughness less than 1 RMS when untreated.

7. The system of claim 1, wherein the anisotropic conductive adhesive extends beyond a perimeter of the bottom electrode's actuator-frame facing surface.

8. The system of claim 1, wherein the anisotropic conductive adhesive layer is greater than 100 microns thick.

9. A piezoelectric micro-electro-mechanical system (MEMS) scanning mirror system comprising:
   an actuator frame comprising electrically conductive material;
   a piezoelectric actuator;
   an anisotropic conductive adhesive layer between a bottom of the piezoelectric actuator and a top surface of the actuator frame, wherein the anisotropic conductive adhesive only conducts electricity in a direction perpendicular to the top surface of the actuator frame; and
   a mirror extending across a gap in a central mounting member of the actuator frame and coupled to the top surface of the actuator frame.

10. The system of claim 9, wherein the anisotropic conductive adhesive extends beyond a perimeter of the bottom electrode's actuator-frame facing surface.

11. The system of claim 9, wherein the anisotropic conductive adhesive layer is greater than 100 microns thick.

12. The system of claim 9, wherein the top surface of the actuator frame comprises a material with a surface roughness less than 1 RMS when untreated.

13. The system of claim 9, wherein a top surface of the actuator frame has a surface roughness between 2 RMS and 6 RMS after roughening.

14. A piezoelectric micro-electro-mechanical system (MEMS) scanning mirror system, the system comprising:
   an actuator frame comprising electrically conductive material;
   a piezoelectric actuator;
   a conductive adhesive layer between a bottom of the piezoelectric actuator and a top surface of the actuator frame, wherein the anisotropic conductive adhesive only conducts electricity in a direction perpendicular to the top surface of the actuator frame; and
   a mirror extending across a gap in a central mounting member of the actuator frame and coupled to the top surface of the actuator frame.

15. The system of claim 14, wherein the conductive adhesive layer is an anisotropic conductive adhesive.

16. The system of claim 15, wherein the anisotropic conductive adhesive layer is greater than 100 microns thick.

17. The system of claim 16, wherein a top surface of the actuator frame has a surface roughness between 2 RMS and 6 RMS.

18. The system of claim 14, wherein the top surface of the actuator frame comprises a material with a surface roughness less than 1 RMS when untreated.

* * * * *